US009934941B2

(12) United States Patent
Sonoda

(10) Patent No.: US 9,934,941 B2
(45) Date of Patent: Apr. 3, 2018

(54) ETCHING APPARATUS AND ETCHING METHOD

(71) Applicant: TOSHIBA MEMORY CORPORATION, Minato-ku, Tokyo (JP)

(72) Inventor: Yasuyuki Sonoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 465 days.

(21) Appl. No.: 14/644,159

(22) Filed: Mar. 10, 2015

(65) Prior Publication Data

US 2016/0093469 A1 Mar. 31, 2016

Related U.S. Application Data

(60) Provisional application No. 62/057,790, filed on Sep. 30, 2014.

(51) Int. Cl.
*H01J 37/00* (2006.01)
*H01J 37/305* (2006.01)
*H01J 37/302* (2006.01)

(52) U.S. Cl.
CPC ........ *H01J 37/3053* (2013.01); *H01J 37/302* (2013.01); *H01J 2237/334* (2013.01)

(58) Field of Classification Search
CPC . H01J 37/3053; H01J 37/302; H01J 2237/334
USPC .......................................... 250/492.1–492.3
See application file for complete search history.

(56) References Cited

U.S. PATENT DOCUMENTS

| 2005/0040346 | A1* | 2/2005 | Lee | ................... | G02F 1/133734 |
| | | | | | 250/492.21 |
| 2008/0202920 | A1* | 8/2008 | Iwaya | ...................... | G01N 1/32 |
| | | | | | 204/192.34 |
| 2012/0192953 | A1* | 8/2012 | Matsushima | ..... | H01J 37/32192 |
| | | | | | 137/1 |
| 2012/0298884 | A1* | 11/2012 | Nakajima | ............... | H01J 37/20 |
| | | | | | 250/453.11 |

(Continued)

FOREIGN PATENT DOCUMENTS

JP        2012227282 A     11/2012

OTHER PUBLICATIONS

Michael A. Vyvoda, et al, "Feature Evolution Simulations of Copper Seed Layer Deposition Using Atomic-Level Particle Scattering Information", IEEE Transactions on Plasma Science, vol. 27, No. 5, Oct. 1999, pp. 1433-1440.

*Primary Examiner* — Michael Maskell
(74) *Attorney, Agent, or Firm* — Holtz, Holtz & Volek PC

(57) ABSTRACT

According to one embodiment, an etching apparatus includes a stage in an etching chamber, the stage which holds one of a first substrate and a second substrate, a plasma generator in the etching chamber, the plasma generator which is opposite to the stage and irradiates an ion beam toward the stage, a grid which is provided between the plasma generator and the stage, a supporter supporting the stage, the supporter having a rotational axis in a direction in which the ion beam is irradiated, a controller which is configured to mount the first substrate on the stage and irradiate the ion beam with the beam angle larger than 0° to the first substrate, when an elapsed time from an end of an etching of a predetermined layer in the second substrate is equal to or larger than a predetermined time.

20 Claims, 8 Drawing Sheets

(56) References Cited

U.S. PATENT DOCUMENTS

2015/0318185 A1* 11/2015 Kodaira ................ H01J 37/321
438/9

* cited by examiner

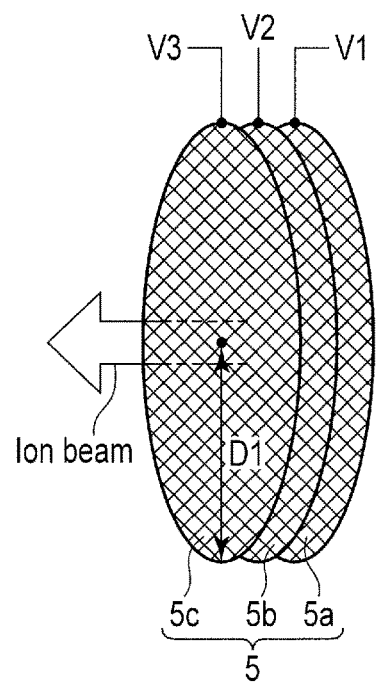
F I G. 2
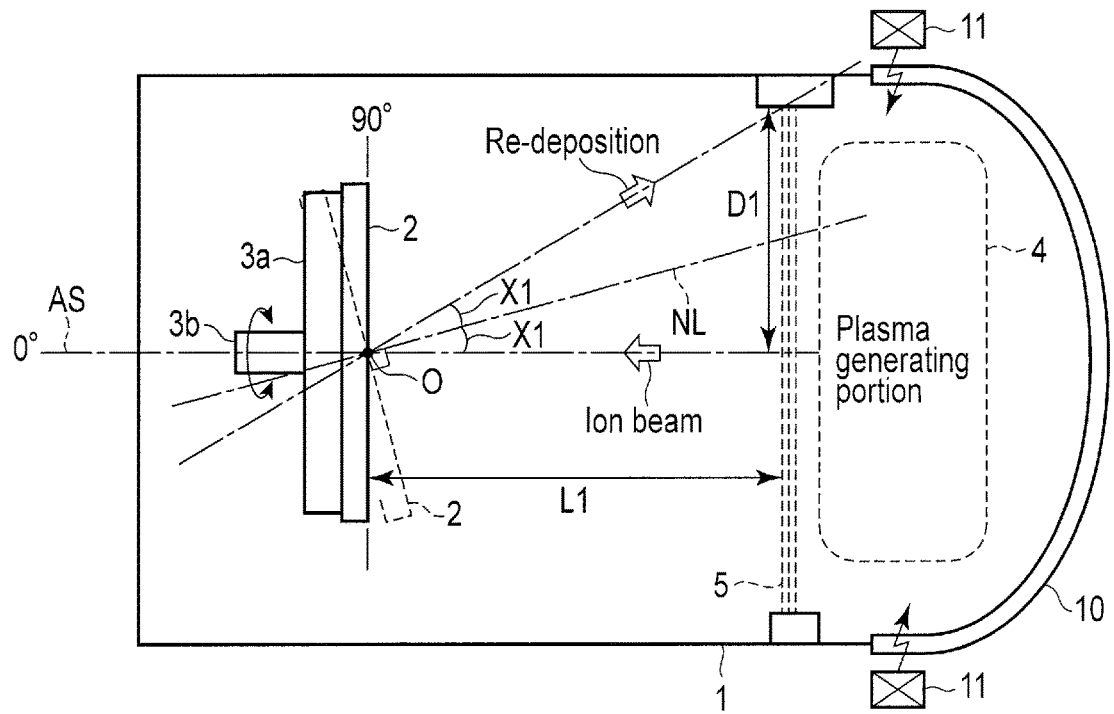
F I G. 3

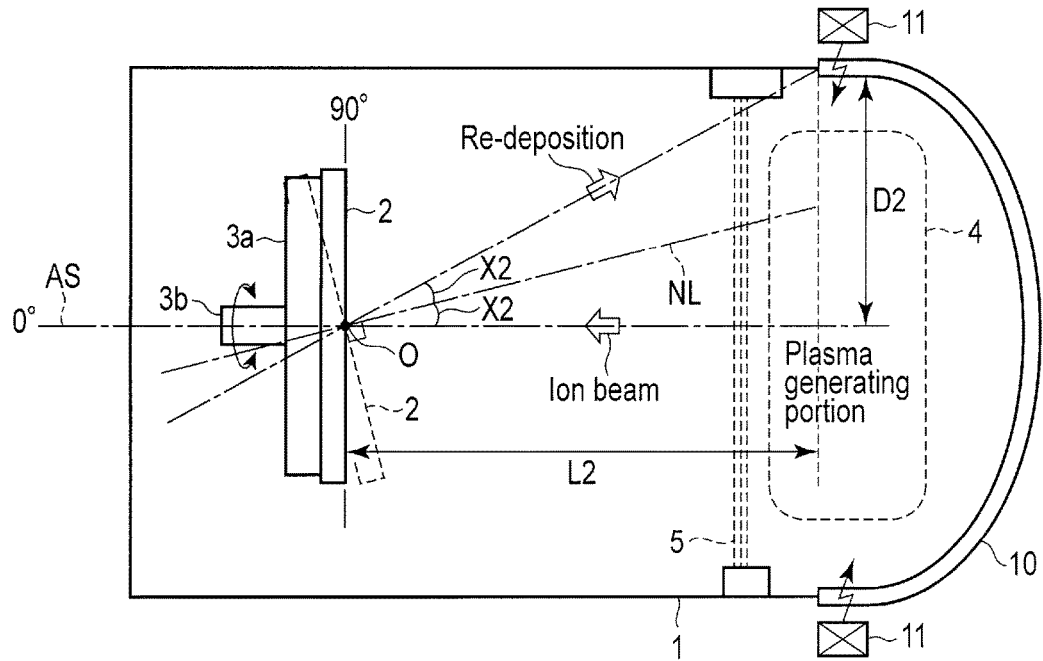
F I G. 4
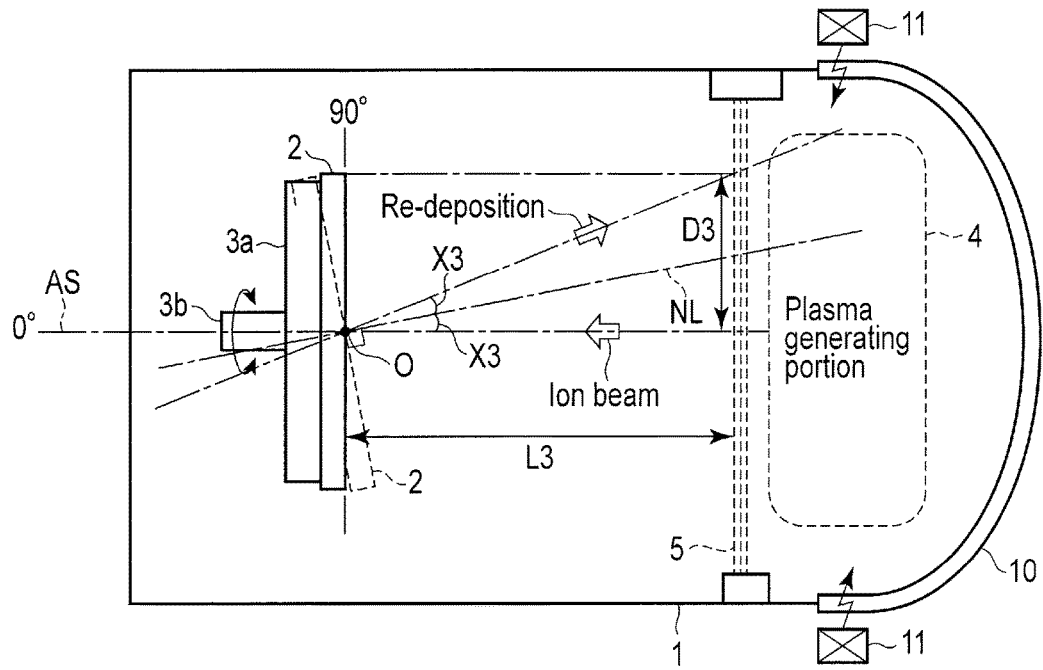
F I G. 5

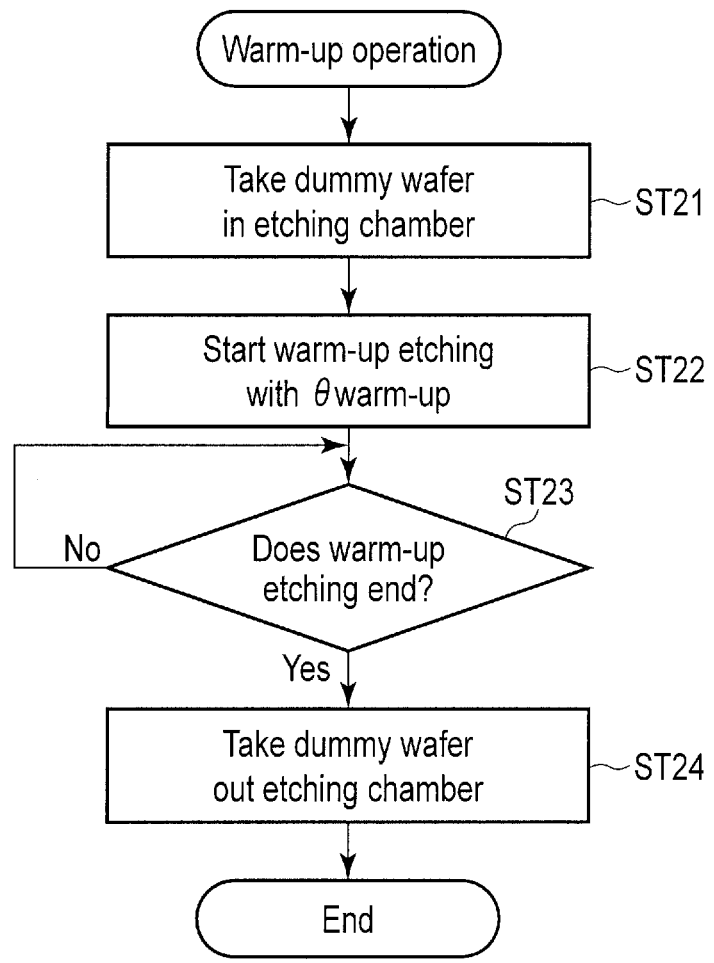
F I G. 7

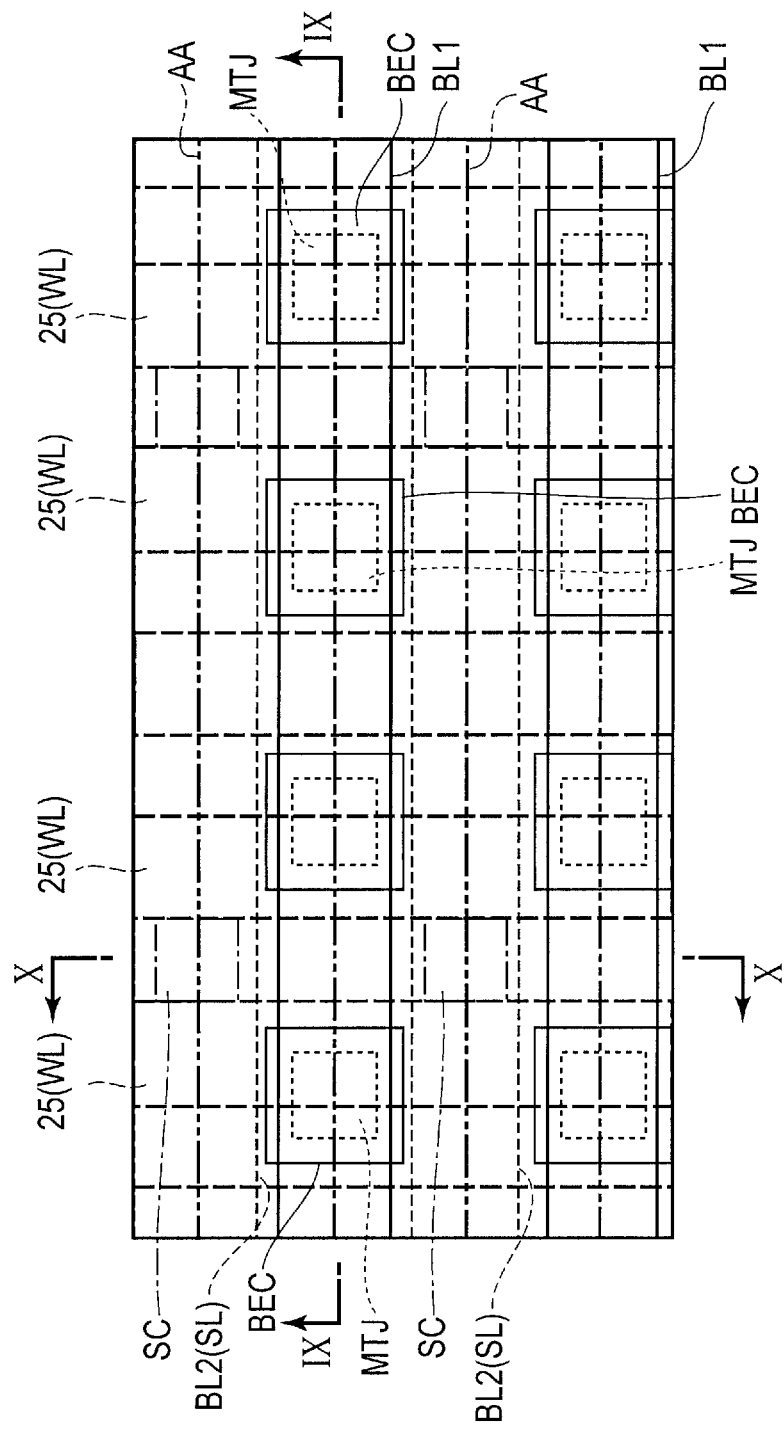
F I G. 8

ETCHING APPARATUS AND ETCHING METHOD

CROSS-REFERENCE TO RELATED APPLICATIONS

This application claims the benefit of U.S. Provisional Application No. 62/057,790, filed Sep. 30, 2014, the entire contents of which are incorporated herein by reference.

FIELD

Embodiments described herein relate generally to an etching apparatus and an etching method.

BACKGROUND

Various types of devices having magnetic layers have recently been developed. A magnetic memory STT (Spin Transfer Torque)-MRAM (magnetic random access memory) as one of those devices stores data in a magnetic layer.

In the devices, the magnetic layer is patterned by physical etching, such as ion beam etching (IBE). Thus, development of an etching apparatus for performing such physical etching is indispensable for the development of new devices having magnetic layers.

In physical etching, however, an etched magnetic and/or metal material may be re-deposited in an etching chamber. Such a re-deposited material in the etching chamber may serve as a source of dust or abnormal discharge, which shortens the maintenance cycle of the etching device. Namely, the re-deposit may cause reduction of the maintenance lifetime.

BRIEF DESCRIPTION OF THE DRAWINGS

FIG. 2 is a view showing a grid in detail;

FIG. 3 shows a first example associated with an ion beam direction and a re-deposition direction;

FIG. 4 shows a second example associated with the ion beam direction and the re-deposition direction;

FIG. 5 shows a third example associated with the ion beam direction and the re-deposition direction;

FIG. 7 is a flowchart for explaining a warm-up operation example of the etching device shown in FIG. 1;

FIG. 8 shows memory cells of an MRAM;

DETAILED DESCRIPTION

In general, according to one embodiment, an etching chamber; a stage in the etching chamber, the stage which holds one of a first substrate and a second substrate; a plasma generator in the etching chamber, the plasma generator which is opposite to the stage and irradiates an ion beam toward the stage; a grid which is provided between the plasma generator and the stage; a supporter supporting the stage, the supporter having a rotational axis in a direction in which the ion beam is irradiated; a first driver changing a beam angle between a direction which is perpendicular to an upper surface of the stage and the direction in which the ion beam is irradiated; a second driver which is rotated the stage on the rotational axis; and a controller which is configured to: mount the first substrate on the stage and irradiate the ion beam with the beam angle larger than 0° to the first substrate, when an elapsed time from an end of an etching of a predetermined layer in the second substrate is equal to or larger than a predetermined time.

1. Etching Apparatus

Figure 1:
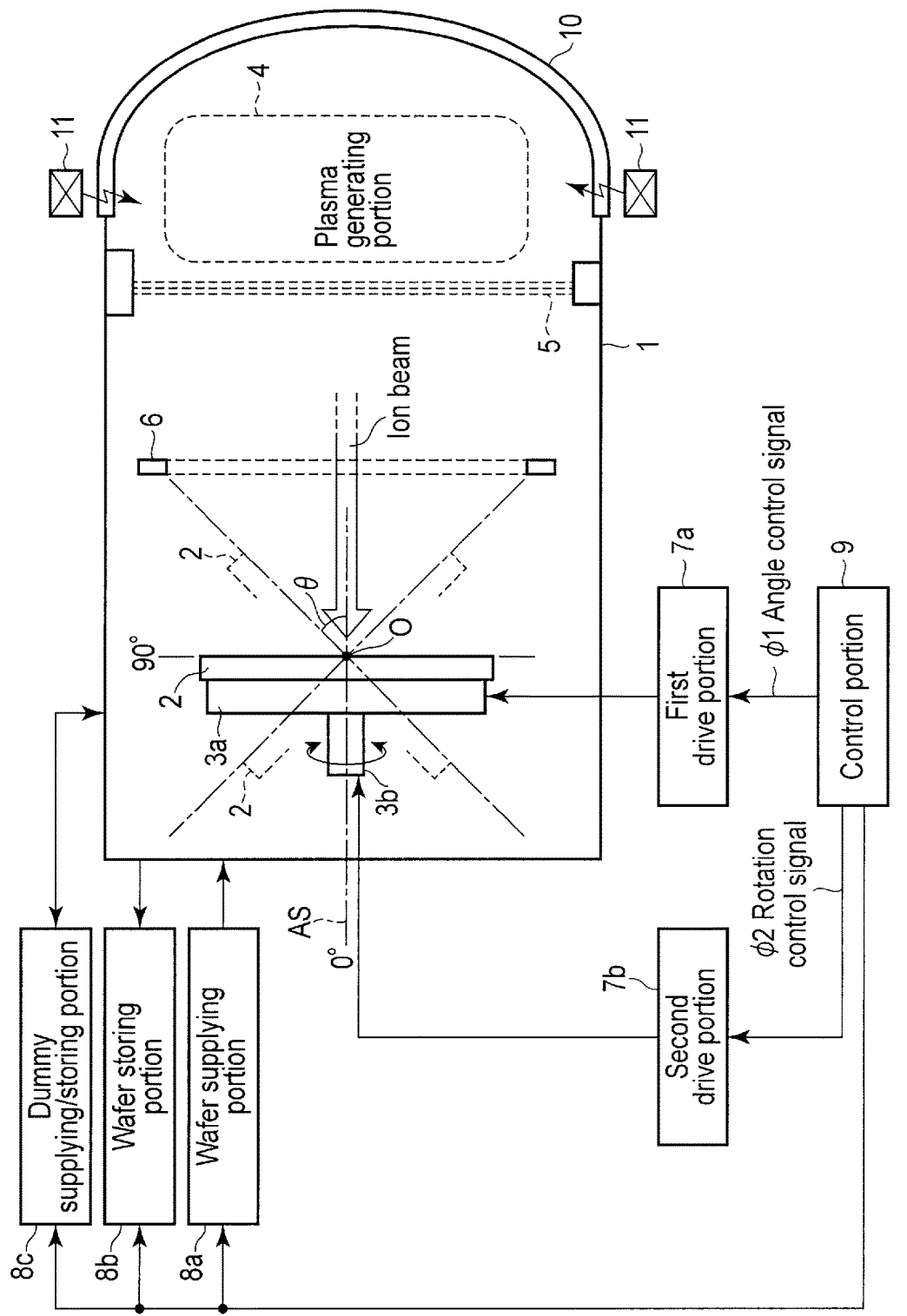
FIG. 1 is a schematic block diagram showing an etching device.

FIG. 1 shows an outline of an etching apparatus according to the embodiment.

An etching chamber 1 is a physical etching chamber for patterning an etching layer in a wafer 2 by, for example, IBE. The wafer 2 is a substrate on which a magnetic memory (such as an MRAM) is formed. Stage 3a is located in the etching chamber 1 to place thereon the wafer 2 including an etching layer. Stage 3a is supported by a support portion (a supporter) 3b.

The orientation perpendicular to the upper surface of stage 3a (or the upper surface of the wafer 2) can be angled by θ with respect to the application direction of an ion beam. Namely, the angle θ between the orientation perpendicular to the upper surface of stage 3a and the application direction of the ion beam can be varied. The angle θ corresponds to a beam angle and can be varied within a predetermined angle range.

In the embodiment, stage 3a with a beam angle θ of 0° is indicated by the solid line, and stage 3a with a beam angle θ of 45° is indicated by the broken lines.

Further, support portion 3b has rotation axis AS rotatable about point O. Rotatable axis AS is parallel to the application direction of the ion beam when the angle θ is 0°. Support portion 3b rotates along with stage 3a inclined by, for example, the angle θ. Stage 3a and support portion 3b serve to rotate the wafer 2 during ion beam application. By this rotation, wafer in-plane uniformity (σ) in the etching rate of the wafer 2 can be enhanced.

A plasma generating portion (a plasma generator) 4 is provided in the etching chamber 1. The plasma generating portion 4 is opposed to stage 3a and is used to generate ions providing an ion beam. The plasma generating portion 4 is made separate from the stage 2 by means of a grid 5.

The grid 5 comprises first, second and third electrodes 5a, 5b and 5c, as shown in FIG. 2. For instance, by applying plus voltage V1 and minus voltage V2 and ground voltage V3 to first, second and third electrodes 5a, 5b and 5c, respectively, ions generated by the plasma generating portion 4 are guided toward the wafer 2 via the grid 5, whereby an ion beam is generated. The ion beam contains Ne, Ar, Kr, Xe, $N_2$ or $O_2$, for example.

A shutter 6 is openable and closable, and is interposed between stage 3a and the grid 5. The shutter 6 is in the open state during etching, and is in the closed state at the other times so that no ion beams are applied to the wafer 2.

A plasma power supply window 10 is an element for permitting an electromagnetic wave (energy) from an antenna 11 to be guided to the plasma generating portion 4 to thereby cause the same to generate plasma. The antenna 11 is in the shape of a ring and is extended around the etching chamber 1.

A first drive portion (a first driver) 7a is used to rotate stage 3a about the point O to change the orientation of stage 3a and adjust the beam angle θ. Further, a second drive portion (a second driver) 7b is used to rotate stage 3a about rotation axis AS (support portion 3b).

Wafer supplying portion 8a sequentially supplies wafers 2 before etching (i.e., wafers waiting for processing) onto stage 3a in the etching chamber 1. Wafer storing portion 8b sequentially stores wafers 2 after etching (i.e., already processed wafers) fed out of stage 3a of the etching chamber 1.

Dummy supplying/storing portion 8c supplies a dummy (wafer) onto stage 3a in the etching chamber 1 at the start of a warm-up operation, and recovers the dummy from stage 3a of the etching chamber 1 at the end of the warm-up operation.

A control portion (a controller) 9 controls first drive portion 7a, second drive portion 7b, wafer supplying portion 8a, wafer storing portion 8b and dummy supplying/storing portion 8c.

For instance, during the warm-up operation, the control portion 9 controls the beam angle θ using first drive portion 7a and controls the rotation direction and rotational speed of stage 3a using second drive portion 7b, so that a magnetic material or a metal material flying apart from the dummy during etching is prevented from being re-deposited on an important element, such as the grid 5, in the etching chamber 1.

The warm-up operation will now be described.

The warm-up operation means a tentative operation for stabilizing the state of the etching apparatus. Namely, by performing a warm-up operation (etching the dummy) under predetermined conditions, an ion beam current, for example, applied to wafer products during etching can be set to the same value, whereby variation in the etching rate among the wafer products can be suppressed.

For instance, if no warm-up operation is performed, a difference may occur in warpage due to, for example, thermal expansion of the grid 5 between the etching operation of a first wafer and the etching operation of each of second et seq. wafers, with the result that the etching rate of the magnetic layer may differ between the etching operation of the first wafer and the etching operation of each of the second et seq. wafers, and hence stability or uniformity of the etching rate of the magnetic layer cannot be secured.

For the above reason, a warm-up operation is performed under the predetermined conditions before starting the etching operation.

However, if during the warm-up operation, a magnetic material or a metal material flying apart from the dummy is re-deposited on an important element, such as the grid 5, in the etching chamber 1, the period in which the etching apparatus can be continuously operated without maintenance is reduced. This inevitably involves increase in COC (cost of consumable).

For instance, during the warm-up operation, if the ion beam angle is set to 0°, a much greater amount of re-deposit is deposited on the grid 5 than in the case where the ion beam angle is set to a value exceeding 0°. The re-deposit deposited on the grid 5 may cause abnormal discharge, for example, between first, second and third electrodes 5a, 5b and 5c shown in FIG. 2.

If such a state often occurs, a maintenance, for example, replacing the grid 5 having the re-deposit with a new or cleaned grid 5 becomes necessary. Namely, as described above, if re-deposition easily occurs on the grid 5, the maintenance cycle is shortened, and accordingly COC is increased.

In view of the above, the embodiment proposes a technique of suppressing, during the warm-up operation, re-deposition of a magnetic and/or metal material, flying apart from a dummy by etching, on an important element, such as the grid 5, in the etching chamber 1, thereby elongating the maintenance cycle of the etching apparatus and reducing the COC.

More specifically, in the embodiment, during the warm-up operation, the ion beam angle θ is set to a value exceeding 0°. When the ion beam angle θ is 0°, a material flying apart from the wafer 2 by etching is directly guided onto an important element, such as the grid 5. If the ion beam angle θ is set to a value exceeding 0°, i.e., if the ion beam is obliquely applied to stage 3a, the amount of the material guided to an important element, such as the grid 5, can be reduced.

FIG. 3 shows a first example associated with the ion beam direction and the discharge direction of the material flying apart from the wafer by etching.

This example shows conditions for enabling the material flying apart from the wafer 2 to be little deposited on the entire grid 5.

Assuming that the distance between the upper surface of the wafer 2 and the grid 5 is L1, and that the distance between the center of the grid 5 and an end of the grid 5 is D1, the beam angle (incident angle or reflection angle) θ is set to X1° or more. For instance, the beam angle θ at the time of the warm-up operation is set to X1° or more. As a result, the material flying apart from the wafer 2 is mainly deposited on anti-deposition parts (shield member) provided on the inner wall of the etching chamber 1, and is not easily deposited on the grid 5.

Assume here that $X1=\{\tan^{-1}(D1/L1)\}/2$, and that the ion beam angle (incident angle) X1 is equal to reflection angle X1 of the material flying apart from the wafer by etching with respect to the normal line NL perpendicular to the upper surface of the wafer 2. Assume also that the grid 5 is, for example, circular, and D1 is the radius of the grid 5.

FIG. 4 shows a second example associated with the ion beam direction and the discharge direction of the material flying apart from the wafer by etching.

This example shows conditions for enabling the material flying apart from the wafer 2 to be little deposited on the plasma power supplying window 10.

The plasma power supply window 10 is an element for permitting an electromagnetic wave (energy) from the antenna 11 to be guided to the plasma generating portion 4 to thereby cause the same to generate plasma. Accordingly, the plasma power supply window 10 is formed of a transparent material capable of easily transmitting therethrough the electromagnetic wave from the antenna 11.

If the material flying apart from the wafer is re-deposited on the plasma power supplying window 10, an electromagnetic wave from the antenna 11 cannot efficiently be transmitted to the plasma generating portion 4, and therefore the re-deposition must be reduced.

In consideration of the above, the ion beam angle (incident angle or reflection angle) θ is set.

Assuming that the distance, parallel to rotation axis AS, between the upper surface of the wafer 2 and the plasma power supplying window 10 is L2, and that the distance between rotation axis SA and the plasma power supplying window 10 is D2, the ion beam angle θ is set equal to X2° or more.

For instance, the beam angle θ at the time of the warm-up operation is set to X2° or more. In this case, the material flying apart from the wafer and deposited on the plasma power supplying window 10 is less than in the case where the beam angle θ at the time of the warm-up operation is set to 0°. As a result, the maintenance lifetime can be increased.

Assume, however, that X2={tan$^{-1}$(D2/L2)}/2, and that ion beam angle (incident angle) X2 is equal to reflection angle X2 of the re-deposit with respect to the normal line NL perpendicular to the upper surface of the wafer 2.

FIG. 5 shows a third example associated with the ion beam direction and the discharge direction of the material flying apart from the wafer by etching.

This example shows conditions for enabling the material flying apart from the wafer 2 to be little deposited on the effective area of the grid 5.

The effective area of the grid 5 means an area through which the ion beam applied to the wafer 2 passes. For instance, if the wafer 2 and the grid 5 are both circular, and if they are coaxial with the rotation axis AS, the size D3 of the effective area of the grid 5 corresponds to the radius of the wafer 2.

Assuming that the distance between the upper surface of the wafer 2 and the grid 5 is L3, and that the size of the effective area of the grid 5 is D3, the ion beam angle θ is set to X3° or more. For instance, the beam angle θ is set to X3° or more during the warm-up operation. This enables the material flying apart from the wafer 2 to be little deposited on the effective area of the entire grid 5. Assume also that the grid 5 is, for example, circular, and D3 is the radius of the effective area of the grid 5.

2. Operation of Etching Apparatus

The operation of the etching apparatus shown in FIGS. 1 to 5 will be described.

Figure 6:
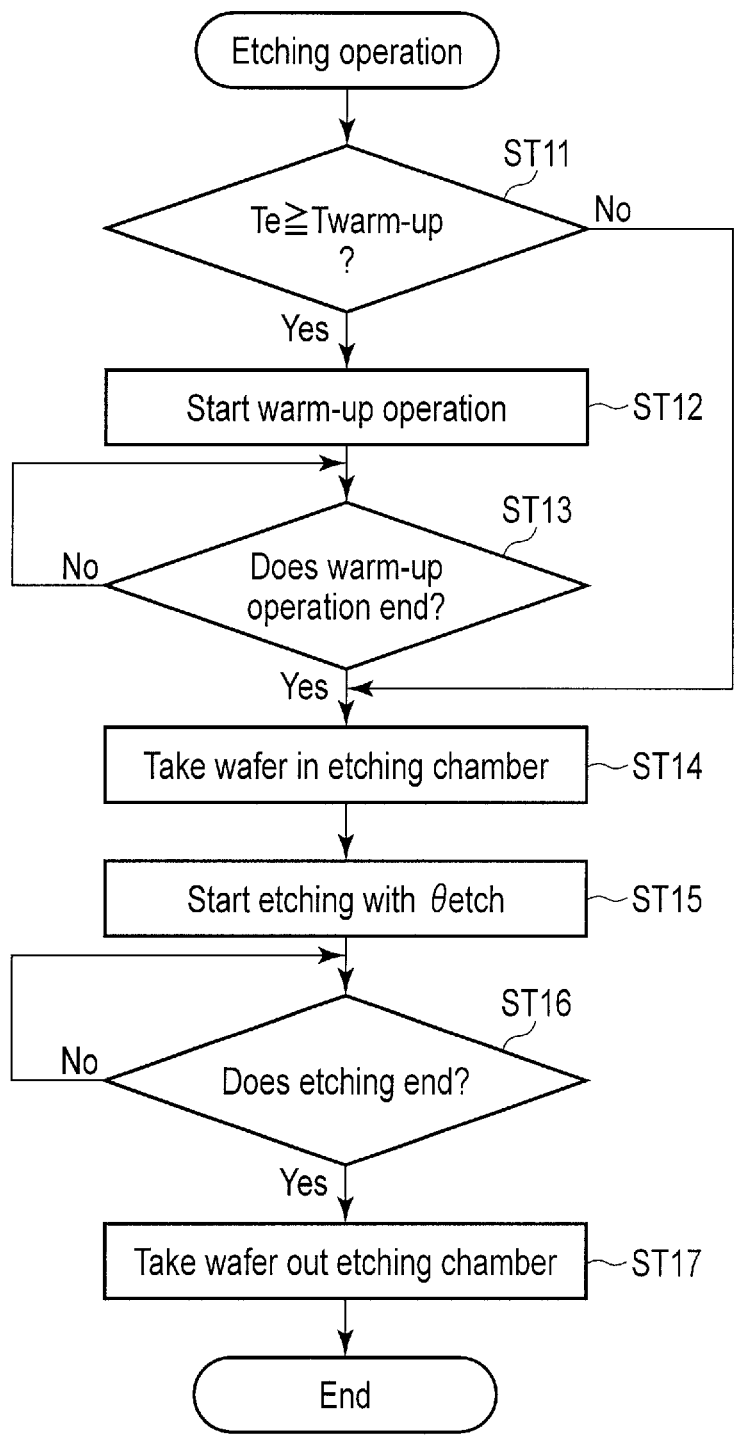
FIG. 6 is a flowchart for explaining an etching operation example of the etching device shown in FIG. 1.

FIG. 6 shows an operation example of the etching apparatus.

This operation is controlled by the control portion 9 shown in FIG. 1.

Firstly, it is determined whether a warm-up operation should be performed before starting the etching operation (step ST11).

For instance, it is determined whether an elapsed time Te after a preceding etching operation is equal to or more than a predetermined period Twarm-up required for the warm-up operation. If Te Twarm-up, it is determined that the etching apparatus is in a cold state, and hence a warm-up operation is performed. In contrast, if Te<Twarm-up, it is determined that the etching apparatus is in a steady state, and hence an etching operation is performed without performing the warm-up operation.

However, if it is determined for each wafer (i.e., whenever an etching operation is performed) whether the warm-up operation should be performed, the control of, for example, the control portion 9 becomes complex.

In view of this, it is assumed, for example, that a plurality of wafers (e.g., 25 wafers) belonging to one lot will be continuously processed, and for the etching operations of the wafers belonging to the one lot, the determination as to whether the warm-up operation should be performed may be carried out only one time, i.e., only before the etching of the leading wafer.

Further, the maintenance work (such as exchange of the grid and anti-deposition parts (shield member)) of the etching apparatus generally requires one hour or more. Therefore, the warm-up operation may be always performed after the maintenance work of the etching apparatus.

After starting the warm-up operation, the start of the etching operation is postponed until the warm-up operation finishes (steps ST12 and ST13).

The warm-up operation is executed in accordance with, for example, the flowchart of FIG. 7.

Firstly, a dummy (wafer) is placed on the stage in the etching chamber (step ST21).

Subsequently, an ion beam of a beam angle (incident angle) θetch is applied to the dummy, thereby performing warm-up etching for a predetermined period (step ST22). The beam angle θwarm-up in this etching operation is determined in consideration of the relationship between the direction of the ion beam and the discharge direction of material during etching, shown in, for example, FIGS. 3 to 5.

After the warm-up operation, the dummy is removed from the etching chamber (steps ST23 and ST24).

When Te<Twarm-up or the warm-up operation has finished, an etching operation is started.

Firstly, a wafer (product wafer) is placed onto the stage in the etching chamber (step ST14).

Subsequently, an ion beam of a beam angle (incident angle) θwarm-up is applied to the wafer to etch the etching layer (e.g., a magnetoresistive effect element) (step ST15).

After the etching operation, the wafer is removed from the etching chamber (steps ST16 and ST17).

3. Magnetic Memory

A description will be given of an example of a magnetic memory that can be produced by the above-described etching apparatus and method.

Figure 9:
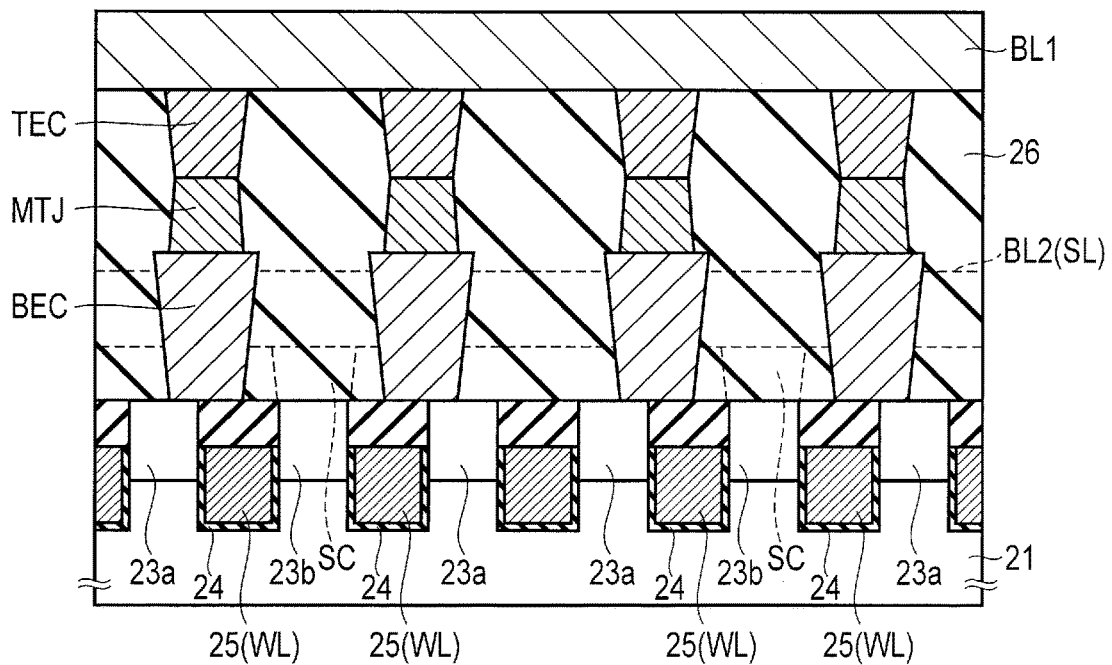
FIG. 9 is a cross-sectional view taken along line IX-IX of FIG. 8.
Figure 10:
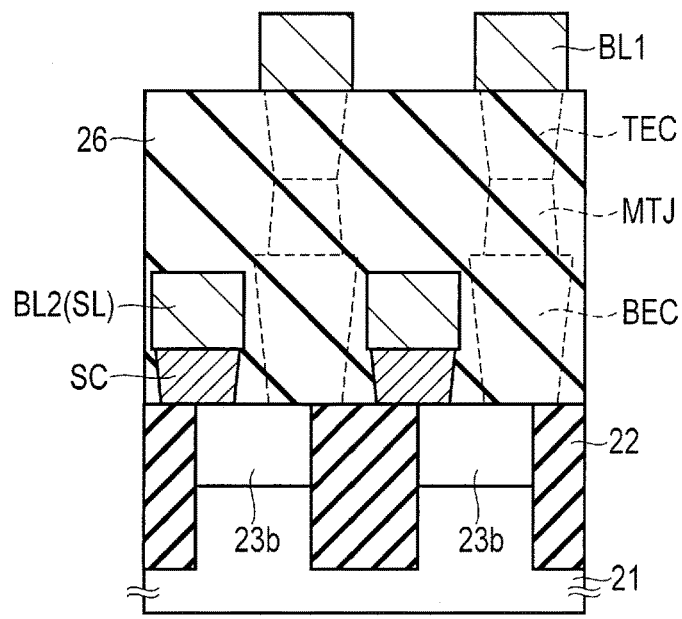
FIG. 10 is a cross-sectional view taken along line X-X of FIG. 8.

FIGS. 8 to 10 show an MRAM memory cell to which the etching apparatus and method are applied. FIG. 8 is a plan view showing memory cells of an MRAM. FIG. 9 is a cross-sectional view taken along line IX-IX of FIG. 8. FIG. 10 is a cross-sectional view taken along line X-X of FIG. 8.

In this example, the memory cells of the magnetic memory each comprise a selective transistor (e.g., a FET) ST and a magnetoresistive effect element MTJ.

The selective transistor ST is located in the active area AA of a semiconductor substrate 21. The active area AA is surrounded by an element isolating layer 22 in the semiconductor substrate 21. In the embodiment, the element isolating layer 22 has a Shallow Trench Isolation (STI) structure.

The selective transistor ST comprises source/drain diffusion layers 23a and 23b in the semiconductor substrate 21, and a gate insulating layer 24 and a gate electrode (word line) 25 formed in the semiconductor substrate 21 between source/drain diffusion layers 23a and 23b. The selective transistor ST of the embodiment has a so-called embedded gate structure in which the gate electrode 25 is embedded in the semiconductor substrate 21.

An interlayer insulation layer (e.g., an oxide silicon layer) 26 covers the selective transistor ST. Contact plugs BEC and SC are provided in the interlayer insulation layer 26. Each contact plug BEC is connected to corresponding source/drain diffusion layer 23a, and each contact plug SC is connected to corresponding source/drain diffusion layer 23b. The contact plugs BEC and SC contain, for example, W, Ta, Ru or Ti.

Magnetoresistive effect elements MTJ are provided on the respective contact plugs BEC, contact plugs TEC are provided on the respective magnetoresistive effect elements MTJ.

Bit lines BL1 are connected to the respective magnetoresistive effect elements MTJ via the respective contact plugs TEC. Bit lines BL2 are connected to respective source/drain diffusion layers 23b via the respective contact plugs SC. Bit lines BL2 also function as source lines SL, to which a ground potential is applied, during, for example, reading.

Figure 11:
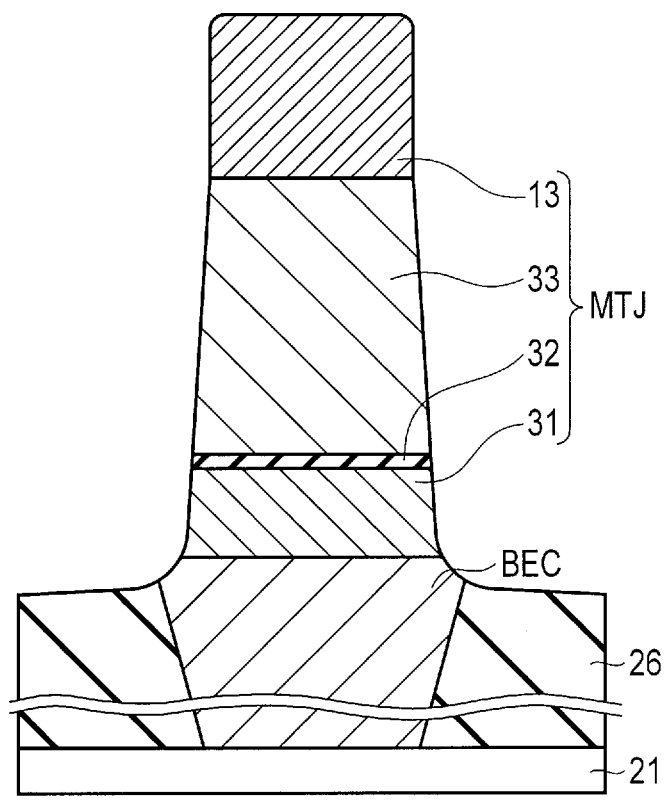
FIG. 11 is a cross-sectional view a magnetoresistive effect element.

FIG. 11 shows an example of the magnetoresistive effect element MTJ shown in FIGS. 8 to 10.

In FIG. 11, elements similar to those shown in FIGS. 8 to 10 are denoted by corresponding reference numbers.

Each magnetoresistive effect element MTJ comprises a first ferromagnetic layer 31 on the corresponding contact plug BEC, a nonmagnetic insulating layer (tunnel barrier layer) 32 on the first ferromagnetic layer 31, a second ferromagnetic layer 33 on the nonmagnetic insulating layer 32, and a hard mask layer 13 on the second ferromagnetic layer 33.

The hard mask layer 13 functions as a mask layer used to process, for example, the magnetoresistive effect element MTJ. The hard mask layer 13 contains, for example, W, Ta, Ru, Ti, TaN, TiN, etc. It is desirable that the hard mask layer 13 comprise stacked layers of materials, such as Ta and Ru, that have a low electrical resistance and high diffusion, etching and milling resistances.

One of the first and second ferromagnetic layers 31 and 33 is a reference layer having invariable magnetization, and the other is a storage layer having variable magnetization.

"Invariable magnetization" means that the direction of magnetization does not change before and after writing, while "variable magnetization" means that the direction of magnetization is inverted before and after writing.

Further, "writing" means spin transfer writing in which spin torque is applied to the magnetization of the storage layer by applying a spin injection current (spin polarized electrons) to the magnetoresistive effect element MTJ.

If the first ferromagnetic layer 31 is a storage layer, and the second ferromagnetic layer 33 is a reference layer, the magnetoresistive effect element MTJ is called a top-pin type. In contrast, if the first ferromagnetic layer 31 is a reference layer, and the second ferromagnetic layer 33 is a storage layer, the magnetoresistive effect element MTJ is called a bottom-pin type.

It is desirable that each of the first and second ferromagnetic layers 31 and 33 have perpendicular magnetization, i.e., residual magnetization parallel to an axis along which the first and second ferromagnetic layers 31 and 33 are stacked. However, each of the first and second ferromagnetic layers 31 and 33 may have in-plane magnetization, i.e., residual magnetization perpendicular to the axis along which the first and second ferromagnetic layers 31 and 33 are stacked.

The resistance of the magnetoresistive effect element MTJ varies, as a result of the magnetoresistive effect, depending upon the relative magnetization direction of the storage and reference layers. For instance, the resistance of the magnetoresistive effect element MTJ is low in a parallel state wherein the storage and reference layers have the same magnetization direction, while the resistance is high in an anti-parallel state wherein the storage and reference layers have opposite magnetization directions.

The first and second ferromagnetic layers 31 and 33 each comprise, for example, CoFeB, MgFeO, or a stacked structure of these materials. In the case of a magnetoresistive effect element having perpendicular magnetization, it is desirable that the first and second ferromagnetic layers 31 and 33 each comprise, for example, TbCoFe having perpendicular magnetic anisotropy, an artificial grating formed by stacking Co and Pt layers, or FePt regulated by L1o. In this case, an interface layer of CoFeB may be interposed between the first ferromagnetic layer 31 and the nonmagnetic insulating layer 32 or between the nonmagnetic insulating layer 32 and the second ferromagnetic layer 33.

The nonmagnetic insulating layer 32 comprises, for example, MgO or AlO. The nonmagnetic insulating layer 14b may be formed of a nitride of Al, Si, Be, Mg, Ca, Sr, Ba, Sc, Y, La, Zr or Hf.

The first and second ferromagnetic layers 31 and 33 may each comprise a shift cancel layer. The shift cancel layer has magnetization of a direction opposite to the magnetization direction of the reference layer. In this case, the shift cancel layer cancels shift of the magnetization inversion characteristic (hysteresis curve) of the storage layer due to the stray magnetic field of the reference layer. It is desirable that the shift cancel layer comprise, for example, a structure [Co/Pt]n in which n layers each comprising Co and Pt films are stacked on each other.

4. Conclusion

As described above, the embodiment can increase the maintenance cycle of the etching apparatus and reduce the COC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching apparatus comprising:
an etching chamber;
a stage in the etching chamber, the stage being configured to hold one of a first substrate and a second substrate;
a plasma generator in the etching chamber, the plasma generator being opposite to the stage and configured to irradiate an ion beam toward the stage;
a grid which is provided between the plasma generator and the stage;
a supporter supporting the stage, the supporter having a rotational axis in a direction in which the ion beam is irradiated;
a first driver configured to change a beam angle between a direction which is perpendicular to an upper surface of the stage and the direction in which the ion beam is irradiated;
a second driver which configured to rotate the stage about the rotational axis; and
a controller which is configured to mount the first substrate on the stage and irradiate the ion beam with the beam angle being larger than 0° to the first substrate, when an elapsed time from an end of an etching of a predetermined layer in the second substrate is equal to or larger than a predetermined time,
wherein:
the ion beam irradiated to the first substrate satisfies the relationships below:

$\theta \geq X$, and $X = \{\tan^{-1}(D/L)\}/2$, where θ denotes the beam angle, L denotes a distance between an upper surface of the first substrate and the grid, and D denotes a distance between a center and an edge of the grid.

2. An etching apparatus comprising:
an etching chamber;
a stage in the etching chamber, the stage being configured to hold one of a first substrate and a second substrate;
a plasma generator in the etching chamber, the plasma generator being opposite to the stage and configured to irradiate an ion beam toward the stage;
a grid which is provided between the plasma generator and the stage;
a supporter supporting the stage, the supporter having a rotational axis in a direction in which the ion beam is irradiated;
a first driver configured to change a beam angle between a direction which is perpendicular to an upper surface of the stage and the direction in which the ion beam is irradiated;
a second driver configured to rotate the stage about the rotational axis; and
a controller which is configured to mount the first substrate on the stage and irradiate the ion beam with the beam angle being larger than 0° to the first substrate, when an elapsed time from an end of an etching of a predetermined layer in the second substrate is equal to or larger than a predetermined time,
wherein:
the ion beam irradiated to the first substrate satisfies the relationships below:

$θ≥X$, and $X=\{\tan^{-1}(D/L)\}/2$, where θ denotes the beam angle, L denotes a distance between an upper surface of the first substrate and the grid, and D denotes a size of an effective area of the grid.

3. The apparatus of claim 1, wherein the first substrate is a substrate used for a warm-up of the etching chamber when the predetermined time or more has elapsed since the end of the etching of the predetermined layer in the second substrate.

4. The apparatus of claim 1, wherein the controller is configured to irradiate the ion beam to the first substrate after a maintenance of the apparatus.

5. The apparatus of claim 1, wherein the controller is configured to execute an etching of a predetermined layer in a third substrate after irradiating the ion beam to the first substrate.

6. The apparatus of claim 1, wherein the ion beam includes one of Ne, Ar, Kr, Xe, $N_2$ and $O_2$.

7. An etching method comprising:
mounting a first substrate on a stage;
irradiating an ion beam with a beam angle larger than 0° to the first substrate;
mounting a second substrate on the stage after irradiating the ion beam to the first substrate; and
etching a predetermined layer in the second substrate after mounting the second substrate on the stage,
wherein:
the ion beam irradiated to the first substrate satisfies the relationships below:

$θ≥X$, and $X=\{\tan-1(D/L)\}/2$, where θ denotes the beam angle, L denotes a distance between an upper surface of the first substrate and a grid, and D denotes a distance between a center and an edge of the grid.

8. An etching method comprising:
mounting a first substrate on a substrate;
irradiating an ion beam with a beam angle larger than 0° to the first substrate;
mounting a second substrate on the stage after irradiating the ion beam to the first substrate; and
etching a predetermined layer in the second substrate after mounting the second substrate on the stage,
wherein:
the ion beam irradiated to the first substrate satisfies the relationships below:

$θ≥X$, and $X=\{\tan^{-1}(D/L)\}/2$, where θ denotes the beam angle, L denotes a distance between an upper surface of the first substrate and a grid, and D denotes a size of an effective area of the grid.

9. The method of claim 7, wherein the first substrate is a substrate used for a warm-up of an etching chamber.

10. The method of claim 7, further comprising:
irradiating the ion beam to the first substrate after a maintenance of an apparatus in which the etching method is performed.

11. The method of claim 7, further comprising:
executing an etching of the predetermined layer in the second substrate continuously after irradiating the ion beam to the first substrate.

12. The method of claim 7, wherein the ion beam includes one of Ne, Ar, Kr, Xe, $N_2$ and $O_2$.

13. The apparatus of claim 2, wherein the first substrate is a substrate used for warming up the etching chamber when the predetermined time or more has elapsed since the end of the etching of the predetermined layer in the second substrate.

14. The apparatus of claim 2, wherein the controller is configured to irradiate the ion beam to the first substrate after a maintenance of the apparatus.

15. The apparatus of claim 2, wherein the controller is configured to execute an etching of a predetermined layer in a third substrate after irradiating the ion beam to the first substrate.

16. The apparatus of claim 2, wherein the ion beam includes one of Ne, Ar, Kr, Xe, $N_2$, and $O_2$.

17. The method of claim 8, wherein the first substrate is a substrate used for a warm-up of an etching chamber.

18. The method of claim 8, further comprising:
irradiating the ion beam to the first substrate after a maintenance of an apparatus in which the etching method is performed.

19. The method of claim 8, further comprising:
executing an etching of the predetermined layer in the second substrate continuously after irradiating the ion beam to the first substrate.

20. The method of claim 8, wherein the ion beam includes one of Ne, Ar, Kr, Xe, $N_2$, and $O_2$.

* * * * *